US010788531B2

(12) United States Patent
Adams et al.

(10) Patent No.: US 10,788,531 B2
(45) Date of Patent: Sep. 29, 2020

(54) REDUCED COST PACKAGE DEVICE SIMULATOR, MANUFACTURING METHOD AND METHOD OF USE

(71) Applicant: Modus Test, LLC, Richardson, TX (US)

(72) Inventors: Lynwood Adams, Rockwall, TX (US); Bruce Rogers, Cumming, GA (US); Jack Lewis, Royse City, TX (US); Tim Conner, Forney, TX (US); Jay Williams, Gilbert, AZ (US); Mike Young, San Jose, CA (US); Dawn Ritz, Rowlett, TX (US)

(73) Assignee: MODUS TEST, LLC, Richardson, TX (US)

( * ) Notice: Subject to any disclaimer, the term of this patent is extended or adjusted under 35 U.S.C. 154(b) by 610 days.

(21) Appl. No.: 14/927,073

(22) Filed: Oct. 29, 2015

(65) Prior Publication Data

US 2016/0124021 A1 May 5, 2016

Related U.S. Application Data

(60) Provisional application No. 62/069,898, filed on Oct. 29, 2014.

(51) Int. Cl.
*G01R 31/28* (2006.01)
*G01R 35/00* (2006.01)
*G01R 1/04* (2006.01)

(52) U.S. Cl.
CPC ......... *G01R 31/2886* (2013.01); *G01R 35/00* (2013.01); *G01R 1/0433* (2013.01); *G01R 31/2848* (2013.01)

(58) Field of Classification Search
None
See application file for complete search history.

(56) References Cited

U.S. PATENT DOCUMENTS

| 3,021,498 | A | * | 2/1962 | Spillar | H02B 1/207 174/251 |
| 5,917,229 | A | * | 6/1999 | Nathan | G01R 1/04 257/529 |

(Continued)

*Primary Examiner* — Paresh Patel
(74) *Attorney, Agent, or Firm* — Christopher A. Proskey; BrownWinick Law Firm

(57) ABSTRACT

An improved package device simulator for the testing of testing sockets, the package device simulator being formed of a first layer of non-conductive rigid substrate with a second layer formed of a plurality of electrically conductive traces being added thereto. A third layer of non-conductive rigid substrate is adhered to the first layer with the second layer being sealed there between. The third layer having a plurality of openings therein, wherein the openings align with and expose a portion of the electrically conductive traces of the second layer. Conductive binding material and contact balls are added to the openings and the chip is cured thereby fusing the contact balls with the exposed portions of the traces. Next, the exposed surfaces are coated with a hardening conductive material, such as layers of Nickel and/or Gold. In this way an improved package device simulator is formed that is durable, easier to manufacture and less expensive than a solid metallic package device simulator.

29 Claims, 10 Drawing Sheets

(56) References Cited

U.S. PATENT DOCUMENTS

| | | | | |
|---|---|---|---|---|
| 5,929,375 A | * | 7/1999 | Glovatsky | H05K 1/0207 |
| | | | | 174/252 |
| 6,265,842 B1 | * | 7/2001 | Hard | H01R 29/00 |
| | | | | 318/466 |
| 6,476,629 B1 | * | 11/2002 | Bjork | G01R 31/2863 |
| | | | | 324/750.05 |
| 2004/0107568 A1 | * | 6/2004 | Khandros | G01R 1/0433 |
| | | | | 29/840 |

* cited by examiner

US 10,788,531 B2

REDUCED COST PACKAGE DEVICE SIMULATOR, MANUFACTURING METHOD AND METHOD OF USE

FIELD OF THE INVENTION

This invention relates to a testing device. More specifically and without limitation, this invention relates to a reduced cost testing device, manufacturing method and method of use.

BACKGROUND OF THE INVENTION

Along with the development of semiconductor chips, a need developed to test these semiconductor chips to ensure that they are manufactured within specified tolerances and function properly. Many manufacturers of semiconductor chips such as Intel®, AMD®, Xilinx®, Texas Instruments®, NVIDIA®, Qualcomm® among countless others manufacture semiconductor chips which are then tested by a chip testing device having a printed circuit board (PCB) with a testing socket that is selectively attached thereto. That is, sockets can be attached to and removed from the PCB. The PCB and testing sockets are generally custom made to fit each semiconductor chip, making them quite expensive.

Once the PCB having the testing socket attached thereto is placed on the chip testing device a handler places the semiconductor chips into the testing socket. The testing socket includes a plurality of electrical contacts that connect to electrical pads on the semiconductor chip. Once this electrical connection is made the chip testing device performs various tests by passing electrical currents through the PCB, testing socket and semiconductor chip being tested. From the results of these tests the manufacturer can determine whether the semiconductor chip is conforming or non-conforming.

While this arrangement is highly effective for determining whether manufactured semiconductor chips are functional and conforming, one problem with this arrangement is that these tests are highly dependent upon the quality of the electrical connection made between the PCB, testing socket and contact pads on the semiconductor chip under test. Over time, due to the wear and tear of use as well as contamination from the environment as well as the manufacturing process (such as dust, oils, and other contamination) the quality of the electrical connection can be affected. When the quality of the electrical connection is poor, this may be attributed to a nonconforming semiconductor chip (also known as a false-positive) which may cause the manufacturer to discard perfectly good semiconductor chips.

One way of ensuring that the electrical connection is good and strong is to implement standard cleaning practices and maintenance practices for the testing socket. One such maintenance practice is to replace all the contacts in the testing socket that connect the electrical pads on the semiconductor chip to the PCB after a predetermined number of cycles or uses. While this practice is effective at curing connection problems, it is both time consuming and costly and it has a tendency to take the socket out of production for an extended period of time. Another disadvantage of this process is that blindly replacing all of the contacts in the testing socket means that many perfectly operating contacts are prematurely replaced, which adds unnecessary cost as well as labor.

To resolve this problem, various socket testing devices were developed which test the individual contacts in these test sockets. An example of one such socket testing device is known as the CR-2601 Gen 2 Contact Resistance Tester manufactured by Wells CTI of 1498 SE Tech Center Pl, Suite 320, Vancouver, Wash. 98683. These testing devices attempt to test the resistance within the testing socket itself, to determine which of the particular electrical contacts have an unacceptable level of resistance and therefore need to be replaced. These socket testing devices attempt to isolate or identify the amount of resistance there is within each of the contacts of the testing socket. This is accomplished by using a package device simulator.

Conventionally a package device simulator has the same footprint, or size and shape as the semiconductor chips that are tested using the testing socket. This has been accomplished, as one example, by forming the package device simulator out of a solid piece of metal. The solid metal chip is highly effective because, it is durable, easily cleaned and can be formed to meet exacting tolerances.

However, this arrangement suffers from many disadvantages as well. Namely, these package device simulators are extremely expensive. This is in large part because they are made in whole or in part of precious metals that are highly conductive such as gold, silver, nickel, copper or the like or any combination thereof. This causes the raw material costs of these package device simulators to be extremely high. In addition, these package device simulators require advanced processes to manufacture such as machining the package device simulators to the excruciating tolerances required, as well as additional manufacturing steps such as buffing, deburring, honing, etc. These sophisticated manufacturing processes are both time consuming as well as complicated, which cause these package device simulators to be expensive to manufacture as well as requiring undesirably long lead times.

Another disadvantage of package device simulators formed out of a solid piece of material, such as gold, silver, nickel, etc. is that all contacts are electrically connected to one another. This electrical interconnection eliminates the possibility of having multiple domains or islands within the package device. This eliminates the possibility of running various tests simultaneously with one another and thereby eliminates the possibility of reducing test time.

Thus, it is a primary object of the invention to provide a reduced cost package device simulator, manufacturing method and method of use that improves upon the state of the art.

Another object of the invention is to provide a reduced cost package device simulator, manufacturing method and method of use that is inexpensive to manufacture.

Yet another object of the invention is to provide a reduced cost package device simulator, manufacturing method and method of use that has less raw material costs therein.

Another object of the invention is to provide a reduced cost package device simulator, manufacturing method and method of use that requires less lead time to manufacture.

Yet another object of the invention is to provide a reduced cost package device simulator, manufacturing method and method of use that is easier to manufacture.

Another object of the invention is to provide a reduced cost package device simulator, manufacturing method and method of use that provides a high quality connection with the contacts of the testing socket.

Yet another object of the invention is to provide a reduced cost package device simulator, manufacturing method and method of use that has a low resistance.

Another object of the invention is to provide a reduced cost package device simulator, manufacturing method and method of use that has a long useful life.

Yet another object of the invention is to provide a reduced cost package device simulator, manufacturing method and method of use that can be easily custom manufactured.

Another object of the invention is to provide a reduced cost package device simulator, manufacturing method and method of use that has an intuitive design.

Yet another object of the invention is to provide a reduced cost package device simulator, manufacturing method and method of use that is durable.

Another object of the invention is to provide a reduced cost package device simulator, manufacturing method and method of use that provides for multiple domains within the device simulator.

Yet another object of the invention is to provide a reduced cost package device simulator, manufacturing method and method of use that allows for an electrical interconnection between any two contacts.

Another object of the invention is to provide a reduced cost package device simulator, manufacturing method and method of use that that allows for an electrical isolation between any two contacts.

Yet another object of the invention is to provide a reduced cost package device simulator, manufacturing method and method of use that allows for simultaneous performance of multiple tests.

These and other objects, features, or advantages of the present invention will become apparent from the specification and claims.

SUMMARY OF THE INVENTION

An improved package device simulator for the testing of testing sockets, the package device simulator being formed of a first layer of non-conductive rigid substrate with a second layer formed of a plurality of electrically conductive traces being added thereto. A third layer of non-conductive rigid substrate is adhered to the first layer with the second layer being sealed there between. The third layer having a plurality of openings therein, wherein the openings align with and expose a portion of the electrically conductive traces of the second layer. Conductive binding material and contact balls are added to the openings and the chip is cured thereby fusing the contact balls with the exposed portions of the traces. Next, the exposed surfaces are coated with a hardening conductive material, such as layers of Nickel and/or Gold. In this way an improved package device simulator is formed that is durable, easier to manufacture and less expensive than a solid metallic package device simulator.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that mechanical, procedural, and other changes may be made without departing from the spirit and scope of the invention(s). The following detailed description is, therefore, not to be taken in a limiting sense, and the scope of the invention(s) is defined only by the appended claims, along with the full scope of equivalents to which such claims are entitled.

As used herein, the terminology such as vertical, horizontal, top, bottom, front, back, end, sides and the like are referenced according to the views, pieces and figures presented. It should be understood, however, that the terms are used only for purposes of description, and are not intended to be used as limitations. Accordingly, orientation of an object or a combination of objects may change without departing from the scope of the invention.

Figure 1:
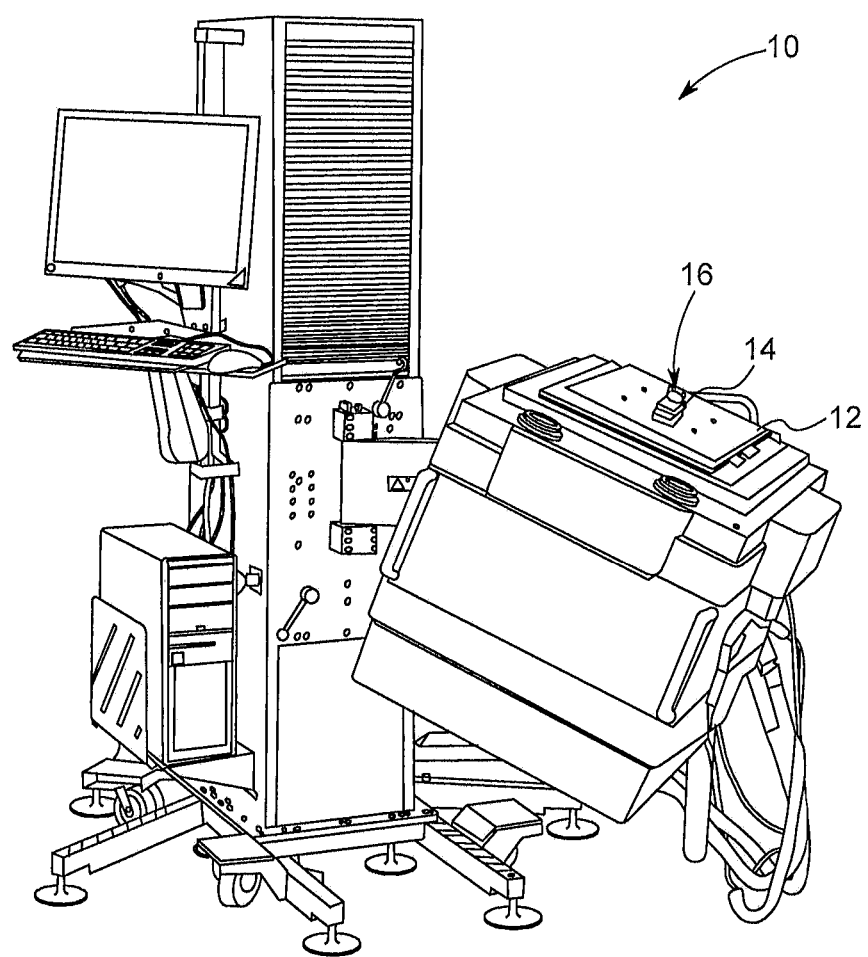
FIG. 1 is a perspective view of a semiconductor chip testing device used in a manufacturing facility, the chip testing device includes a PCB having a testing socket mounted thereto, the figure showing a semiconductor chip about to be tested.
Figure 2:
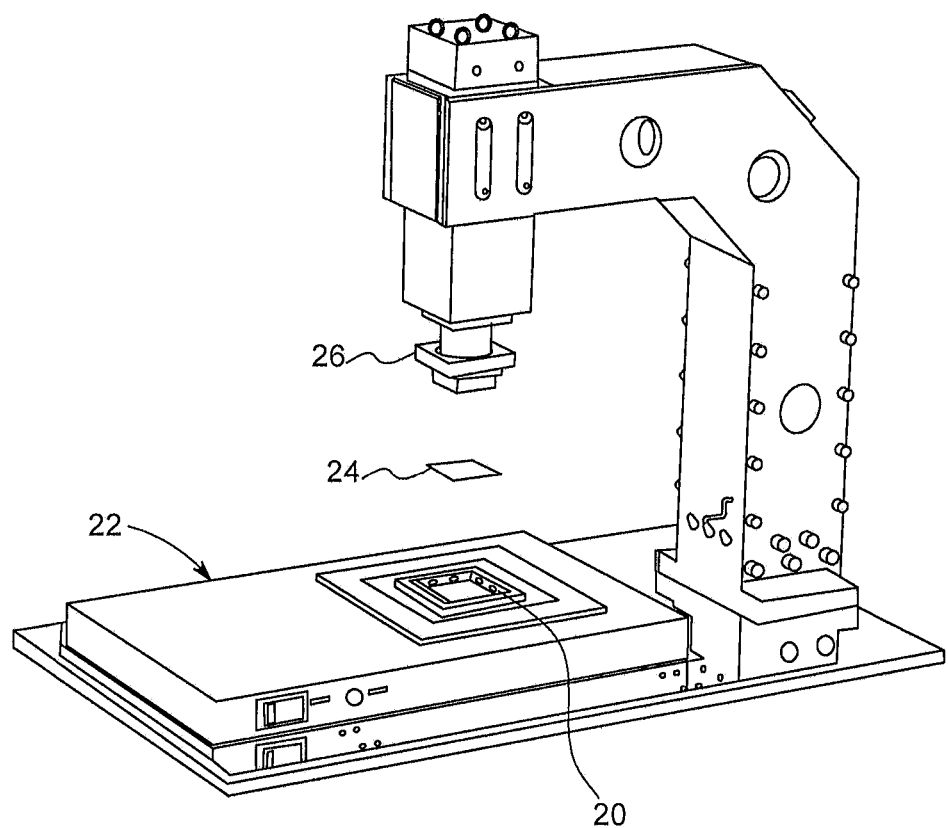
FIG. 2 is a perspective view of a socket testing device having a PCB with the testing socket mounted thereto, the view showing the package device simulator about to be inserted into the testing socket by a plunger of the socket testing device.
Figure 3:
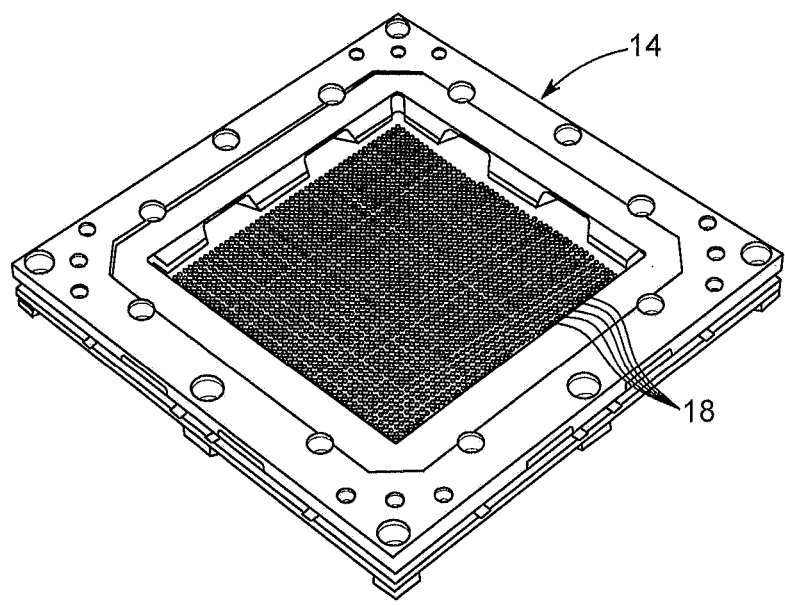
FIG. 3 is a perspective view of a testing socket for a semiconductor chip.
Figure 4:
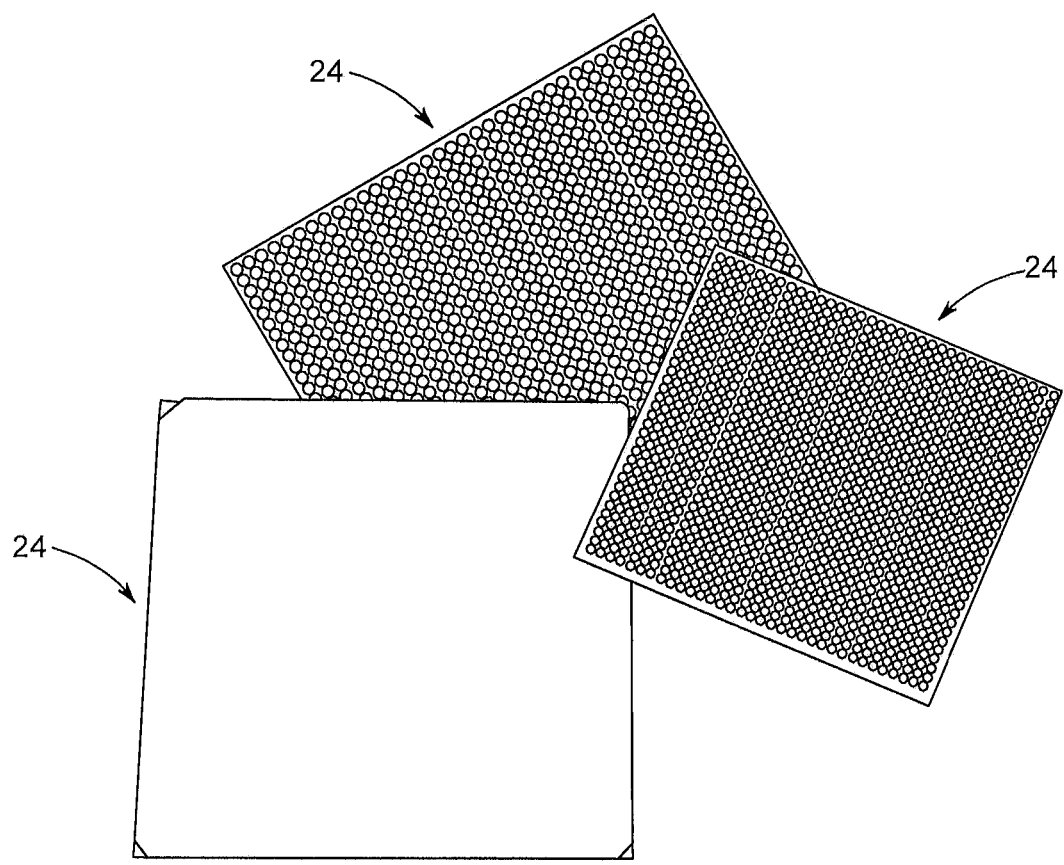
FIG. 4 is a perspective view of a plurality of prior art solid metal package device simulators.
Figure 5:
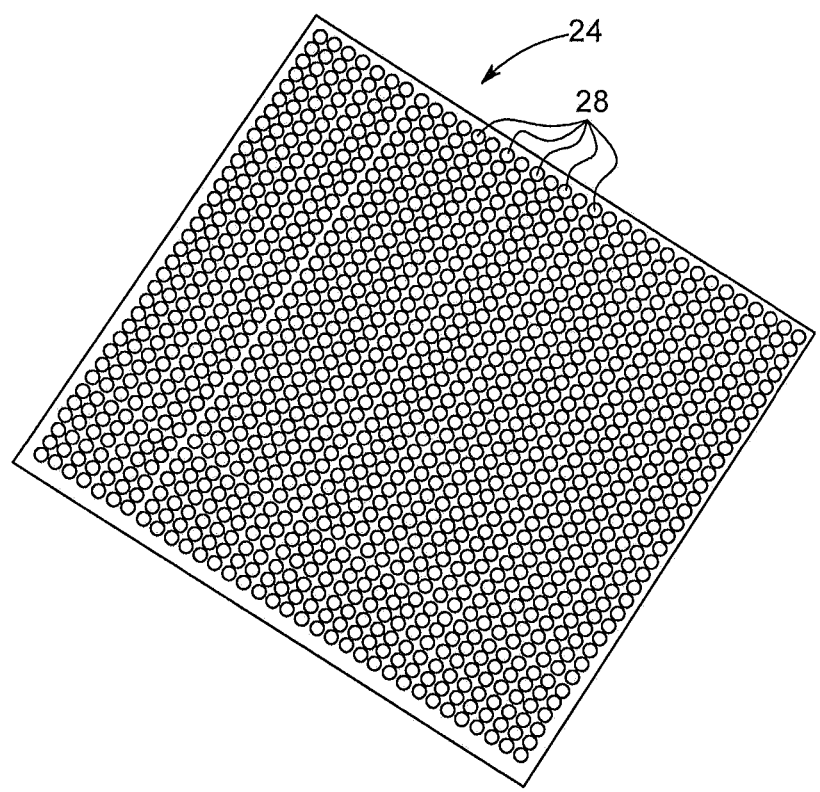
FIG. 5 is a close-up perspective view of the bottom side of a prior art solid metal package device simulator, the view showing the plurality of protruding electrical contacts.

With reference to FIG. 1, a chip testing device 10 is presented such as those used by countless semiconductor chip manufacturers, such as Intel®, AMD® and the like. The chip testing device 10 includes a printed circuit board 12 with a testing socket 14 mounted thereto. In the manufacturing process, the manufactured semiconductor chips 16 are inserted, either manually or by a robotic machine, into the testing socket 14 and the chip testing device 10 passes electrical currents through the printed circuit board 12, testing socket 14 and semiconductor chip 16 to test the semiconductor chip 16. These tests are highly dependent upon having a good electrical connection between the testing socket 14 and the semiconductor chip.

Over time, due to wear and tear as well as contamination the electrical connection between the testing socket 14 and the semiconductor chip 16 can be impaired. Instead of replacing the expensive testing socket 14 altogether, and instead of replacing all of the individual electrical contacts 18 in the testing socket 14, the testing socket 14 is removed from the printed circuit board 12 of the chip testing device 10 to be tested.

More specifically, the testing socket 14 is attached to the printed circuit board 20 of a socket testing device 22. Next a package device simulator 24 is inserted into the testing socket 14 and the plunger 26 presses the package device simulator 24 into the testing socket 14 thereby forcing the electrical contact pads 28 that protrude out of the bottom of the package device simulator 24 into electrical connection with the electrical contacts 18 of the testing socket 14. This downward force causes the extended electrical contacts 18 to slightly compress ensuring, to the extent possible, a strong and low resistance electrical connection is formed there between. That is, unless the electrical connection 18 is contaminated or worn out or suffers from another failure.

Once in this position, current is passed through the socket testing device 22, through the printed circuit board 20, through the testing socket 14 and then through the package device simulator 24. Because the package device simulator 24 is made of a solid low resistance metal, the resistance is known, zero, approximately zero, or constant for this portion of the system. Similarly, the resistance within the printed circuit board 20 is also known before connecting to the testing socket 14. This allows the socket testing device 22 to determine the resistance for each of the electrical contacts 18 within the testing socket 14. This allows faulty electrical contacts 18 to be identified and subsequently is replaced.

One problem with this system is that the solid metal package device simulator 24 is expensive to manufacture and requires long lead times to supply due to the complicated manufacturing processes involved. An improved package device simulator 30 is presented that is not formed of a single solid piece of metal and instead is manufactured out of a plurality of layers.

This improved package device simulator 30 is formed of a first layer 32 or substrate. In one arrangement, first layer 32 is formed of any material that is rigid enough to provide the needed mechanical support and rigidity while also providing the needed level of electrical insulation. In one arrangement, first layer 32 is generally flat and planar in shape and is formed of a fiber glass, hydro carbon, thermo plastic or the like material. This fiber glass provides rigidity, electrical insulation as well as protection against oxidation. In one arrangement, the fiber glass is formed of a traditional tan color, however any color can be used.

Next, a second layer 34 is added to the first layer 32. In one arrangement, second layer 34 is formed of a plurality of electrical traces. Electrical traces 34 are formed of any suitable size, shape, arrangement and composition. In the arrangement shown, as one example, electrical traces 34 are formed of a grid pattern of interconnecting electrically conductive pathways. In the arrangement shown, a plurality of laterally extending traces 36 extend from lateral side to lateral side across the improved package device simulator 30 in approximate parallel spaced alignment to one another; and a plurality of transversely extending traces 38 extend from front to back across the improved package device simulator 30 in approximate parallel spaced alignment to one another. In the arrangement shown, the laterally extending traces 36 extend in approximate perpendicular alignment with transversely extending traces 38 and therefore the laterally extending traces 36 intersect with the transversely extending traces 38 in approximate perpendicular alignment to one another. These intersections 40 of the laterally extending traces 36 and transversely extending traces 38 are positioned in the approximate position of or center of the electrical contact pads 28 shown in the package device simulator 24. In the arrangement shown, the lateral 36 and transverse 38 traces form a grid or matrix where all traces 34 are electrically connected to one another in a grid-like pattern. This arrangement allows for minimum and consistent resistance within the improved package device simulator 30 across the chip.

However, in another arrangement various traces 34 may be electrically isolated or insulated from other electrical traces 34 therefore forming electrically connected sections or quadrants within the improved package device simulator 30 which are electrically isolated or insulated from the other electrically connected sections or quadrants within the improved package device simulator 30. This arrangement, wherein there are electrically isolated or insulated sections on the improved package device simulator 30 is not possible in the prior art solid metallic package device simulator 24 because by the nature of the package device simulator being made of a solid metallic material all electric contact pads 28 are inherently electrically connected to one another. This improved arrangement of having electrically isolated or insulated sections on the improved package device simulator 30 provides greater functionality to the tester.

Traces 34 are added to first layer 32 by any means known in the art such as plating the traces 34 onto the surface of substrate 32, vacuum depositing them onto the surface of substrate 32, or by any other manner or method.

Next, a third layer 42 is added to the second layer 34. In one arrangement, third layer 42 is generally flat and planar in shape and is another layer of substrate similar to or identical to the first layer 32 of substrate. That is, in one arrangement, third layer 42 is formed of any material that is rigid enough to provide the needed mechanical support and rigidity while also providing the needed level of electrical insulation. In one arrangement, third layer 42 is formed of a solder mask, or solder stop mask or solder resist, which may be formed of a thin lacquer-like layer of polymer. This solder mask provides rigidity, electrical insulation as well as protection against oxidation. In one arrangement, the solder mask is formed of a traditional green color, however any color can be used.

Third layer 42 includes a plurality of openings 44 or passageways through the third layer 42. These openings or passageways 44 extend from the top surface of third layer 42 to the bottom surface of third layer 42 providing an unobstructed path through the third layer 42. These openings or passageways 44 are positioned in approximate alignment with the intersections 40 of the traces 34.

In one arrangement, openings or passageways 44 are generally circular in shape and extend through the third layer 42 in a generally cylindrical manner from the top surface of third layer 42 to the bottom surface of third layer 42. However any other form or shape of an opening is hereby contemplated for use such as square, triangular, rectangular, pentagonal, hexagonal, octagonal, nonagonal, decagonal, oval, elliptical, or any other shape. These openings or passageways are sized so that any one opening or passageway 44 does not touch any adjacent opening or passageway 44. In this way, the insulating material of third layer 42 maintains the electrical isolation between individual openings or passageways 44.

Openings or passageways 44 in third layer 42 are formed in third layer 42 in any manner known. In one arrangement, openings or passageways 44 are formed in third layer 42 prior to placing third layer 42 in contact with second layer 34 and/or first layer 32. In one arrangement, this formation may be by mechanical means such as cutting out each opening or passageway 44 using a mechanical process such as drilling, water jetting, laser cutting, punching or the like. In an alternative arrangement, this formation may be by means of chemical processes such as etching, burning, photo-mask and resist removal processes, and the like known in the semiconductor manufacturing area of art. Alternatively, these openings or passageways 44 are formed by any other process. Then, after the formation of the openings or passageways 44 the third layer 42 is placed upon the second layer 34 and/or first layer 32.

In an alternative arrangement, the third layer 42 is placed upon the second layer 34 and/or first layer 32 and then the openings or passageways 44 are formed therein by any means known such as mechanical process such as drilling, water jetting, laser cutting, punching or the like, etching, burning, photo-mask and resist removal processes, and the like, or any other manufacturing process. This formation reveals the underlying intersections 40 of the traces 34.

Next, a layer of conductive binding material 46 is placed in each opening or passageway 44. Conductive binding material 46 is any material that is used to electrically connect two components, or to help ensure or improve electrical connection during a cure, re-melting or re-flowing process. Examples of conductive binding material include solder paste, solder cream, conductive ink, silver epoxy, or any other like material. In one arrangement, conductive binding material is essentially powder metal solder suspended in a thick medium called flux. Flux is added to act as a temporary adhesive, holding the components until the soldering process melts the solder and makes a stronger physical connection. In one arrangement it is a gray, putty-like material. The composition of the solder paste varies, depending upon its intended use. For example, when soldering plastic component packages to a FR-4 glass epoxy circuit board, the solder compositions used are eutectic Sn—Pb (63 percent tin, 37 percent lead) or SAC alloys (tin/silver/copper, Sn/Ag/Cu). If one needs high tensile and shear strength, tin-antimony (Sn/Sb) alloys might be used with such a board. Generally, solder pastes are made of a tin-lead alloy, with possibly a third metal alloyed Conductive binding material 46 is used to connect the leads of surface mount integrated chip packages to attachment points (lands) in the circuit patterns on a printed circuit board. In one arrangement, the conductive binding material 46 is applied to the lands or intersections 40 of traces 34 within openings or passageways 44 by any means known in the art. In one arrangement a stencil is used to "print" or insert the conductive binding material 46 into each opening or passageway 44, in another arrangement, the conductive binding material 46 is injected into each opening or passageway 44, in yet another arrangement the conductive binding material 46 is spread over the top surface of third layer 42 and worked into the openings or passageways 44 such as by squeegeeing or another mechanical process, or alternatively any other process is used.

Next, a contact ball 48 is placed within each opening or passageway 44 and in contact with the conductive binding material 46 and/or traces 34. Contact balls 48 are formed of any suitable size, shape and design. In one arrangement, contact balls 48 are generally spherical in shape. In an alternative arrangement, contact balls 48 are formed of any other shape such as tear-drop shaped, oval, cylindrical, cubical, rectangular, or any other shape. In one arrangement, contact balls 48 are sized and shaped such that they partially fit within opening or passageway 44 while partially protruding out of the opening or passageway 44. In one arrangement, the volume of contact ball 48 is greater than the volume of the opening or passageway 44. This ensures that contact ball 48 protrudes out of opening or passageway 44. This can be managed by managing both the size of contact ball 48 as well as the diameter of the opening or passageway 44 as well as the thickness of third layer 42 as well as the amount of conductive binding material 46 placed within the openings or passageways 44. In one arrangement, the size and shape of contact balls 48 and openings or passageways 44 are controlled in correlation with one another such that the contact balls 48 sit and stay within the openings or passageways 44 while protruding upwardly therefrom, much like a cup sits within a cup holder and extends upward and outward therefrom.

Solder balls 48 are formed of any metallic and/or conductive composition. In one arrangement, solder balls 48 are formed of a Tin-Lead composition. While this composition is effective at carrying electricity as well as making contact with traces 34, components with lead therein are coming under increased regulatory scrutiny and therefore may be undesirable in many applications. In addition, these compositions are very soft and therefore use of package device simulators formed with contacts made of a Tin-Lead composition have a limited number of cycles that they can be used due to deformation. That is, contact pads formed of a Tin-Lead composition can only be used so many times before they deform and therefore are rendered ineffective.

In an alternative arrangement, to avoid using lead various other compositions are hereby contemplated for use such as SAC105 (Sn-3.0Ag-0.5Cu), Sn-3.5Ag (Sn-3.46Ag-0.04Cu) SAC305 (Sn-1.15Ag-0.5Cu), SAC405 (Sn95.5/Ag4.0/Cu0.5), pure copper or high copper-content alloy contact balls. These compositions provide the benefits of being lead free as well as having improved mechanical shock resistance and improved thermal fatigue resistance thereby improving the longevity and useful life of the components over components having Tin-Lead contact balls. Any other composition is hereby contemplated for use.

Once the conductive binding material 46 and contact balls 48 are in place in each of the openings or passageways 44 the improved package device simulator 30 is cured in an oven, through exposure to light or UV light, or by use of any curing device or process. In doing so, the conductive binding material 46 helps to fuse the contact balls 48 to and with the traces 34 positioned thereunder to form a single unitary fused piece that is electrically conductive and rigidly attached. During the curing or re-melting or re-flowing of the contact balls 48, and/or conductive binding material 46, the size and shape of the openings or passageways 44 help to guide and contain the size and shape of the contact balls 48 in their post-melted form. That is, as the contact balls 48, and or conductive binding material 46, re-melt they tend to fill-up the cylindrical openings or passageways 44. Because the volume of the contact ball 48, and/or conductive binding material 46, is greater than the volume of the openings or passageways 44 the excess material of the contact ball 48 protrudes from the opening or passageway 44 above the top surface of the third layer 42 in a partially rounded or domed fashion which is centered on the center of the opening or passageway 44 which is centered on the intersection 40 of the traces 34 below. In the event that the contact balls 48 become more than partially melted, the surface tension of the re-flowed material of contact ball 48 helps to maintain a domed shape. Closely managing the tolerance of the components helps to ensure a consistent position of the center of the contact ball 48 and the height of the contact ball 48 after re-melting or re-flowing.

Once the contact balls 48 have been re-melted or re-flowed and are fused with the conductive binding material 46 and traces 34 the protruding contact balls 48, while having improved mechanical shock resistance and durability than conventional Tin-Lead components, the structural rigidity and durability can still be improved. As such, next the exposed surfaces of the contact balls 48 are coated with additional materials to both harden the exposed surfaces of the contact balls 48 as well as improve the conductivity of the surface of the contact balls 48. The exposed surfaces of the contact balls 48 are coated with conductive material by any means known in the art such as plating, thin film depositing, sputtering, vacuum deposition, or the like.

In one arrangement, the contact balls 48 are first coated with a layer of pure nickel, or nickel alloy, or an alloy high in nickel content (such as 20% or more nickel, or 25% or more nickel, or 30% or more nickel, or 35% or more nickel, or 40% or more nickel, or 45% or more nickel, or 50% or more nickel, or 55% or more nickel, or 60% or more nickel, or 65% or more nickel, or 70% or more nickel, or 75% or more nickel, or 80% or more nickel, or 85% or more nickel, or 90% or more nickel, or 95% or more nickel, or 96% or more nickel, or 97% or more nickel, or 98% or more nickel, or 99% or more nickel. It has been tested, that coating the relatively soft contact balls with nickel or a nickel alloy increases hardness. A layer between one and a thousand hundred micro inches has been tested with success and is contemplated for use, a layer between one and five hundred micro inches is further contemplated for use, a layer between one and three hundred micro inches is further contemplated for use, a layer between fifty and three hundred micro inches is further contemplated for use, a layer between one hundred and three hundred micro inches is further contemplated for use, a layer between one hundred and fifty and three hundred micro inches is further contemplated for use. Plating this layer has been tested with success, however any other method is hereby contemplated for use such as sputtering, thin film deposition, vacuum deposition, or the like.

Next the contact balls 48 are coated with a layer of pure gold or gold alloy or an alloy high in gold content (such as 20% or more gold, or 25% or more gold, or 30% or more gold, or 35% or more gold, or 40% or more gold, or 45% or more gold, or 50% or gold nickel, or 55% or more gold, or 60% or more gold, or 65% or more gold, or 70% or more gold, or 75% or more gold, or 80% or more gold, or 85% or more gold, or 90% or more gold, or 95% or more gold, or 96% or more gold, or 97% or more gold, or 98% or more gold, or 99% or more gold. It has been tested, that coating the contact balls with gold improves the electrical connection and can help prevent oxidation or corrosion of the contact balls 48 or the nickel coating on the contact balls 48. A layer between one and a one hundred micro inches has been tested with success and is contemplated for use, a layer between one and seventy five micro inches is further contemplated for use, a layer between one and fifty micro inches is further contemplated for use, a layer between one and thirty hundred micro inches is further contemplated for use, a layer between one and twenty five micro inches is further contemplated for use, a layer between one and twenty micro inches is further contemplated for use, a layer between one and fifteen micro inches is further contemplated for use, a layer between one and ten micro inches is further contemplated for use, a layer between one and five micro inches is further contemplated for use, a layer between three and five micro inches is further contemplated for use. Plating this layer has been tested with success, however any other method is hereby contemplated for use such as sputtering, thin film deposition, vacuum deposition, or the like.

Alternatively, the gold is coated first followed by the nickel. Alternatively, instead of just two layers, any number of layers of material may be coated, such as additional iterative layers of nickel followed by gold and so on. Alternatively any other materials can be coated over the contact balls in as many layers as is necessary to achieve the needed results.

Once the contact balls 48 are coated, the improved package device simulator 30 is completed and can be used in place of the more expensive solid metal machined package device simulator 24.

In operation, in one arrangement, to form an improved package device simulator 30 the following process is performed. At step 50 a substrate 32 is provided. The substrate 32 is generally flat and planar in shape and is sized and shaped to correlate with the semiconductor chip 16 that is tested in chip testing device 10 and testing socket 14.

Next, at step 52 traces 34 are added to substrate 32, by plating, deposition, sputtering or by any other process, such that they bond to or are held on substrate 32.

Next, at step 54 the second substrate 42 is placed over the traces 34 such that the second substrate bonds to or is held by first substrate 32 and/or traces 34 thereby forming a single unitary bonded or adhered structure. This second substrate 42 either already has the openings or passageways 44 therein when it is added to the traces 34 and first substrate 32, or alternatively the second substrate 42 is added to the traces 34 and first substrate 32 and then the openings or passage ways 44 are formed therein.

Next, at step 56 the conductive binding material 46 is added to the openings or passageways 44.

Next, at step 58, the contact balls 48 are selected and one contact ball 48 is placed in each opening or passageway 48.

Next, at step 60, the partially formed improved package device simulator 30 is cured in an oven or other curing device. This causes the traces 34, conductive binding material 46 and/or contact balls 48 to re-flow or re-melt causing the traces 34, conductive binding material 46 and/or contact balls to fuse to one another thereby forming a unitary rigid structure.

Next, the exposed metallic surfaces of the partially formed improved reference chip 30 are coated with one or more layers of metallic material. In one arrangement, at step 62, the exposed surfaces of contact balls 48 are coated with nickel through a plating process, deposition process, sputtering process or the like and at step 62, the exposed surfaces of contact balls 48 are coated with gold through a plating process, deposition process, sputtering process or the like.

Next, at step 66, the improved package device simulator 30 is used in place of the more expensive solid metallic metal package device simulator 24.

Figure 6:
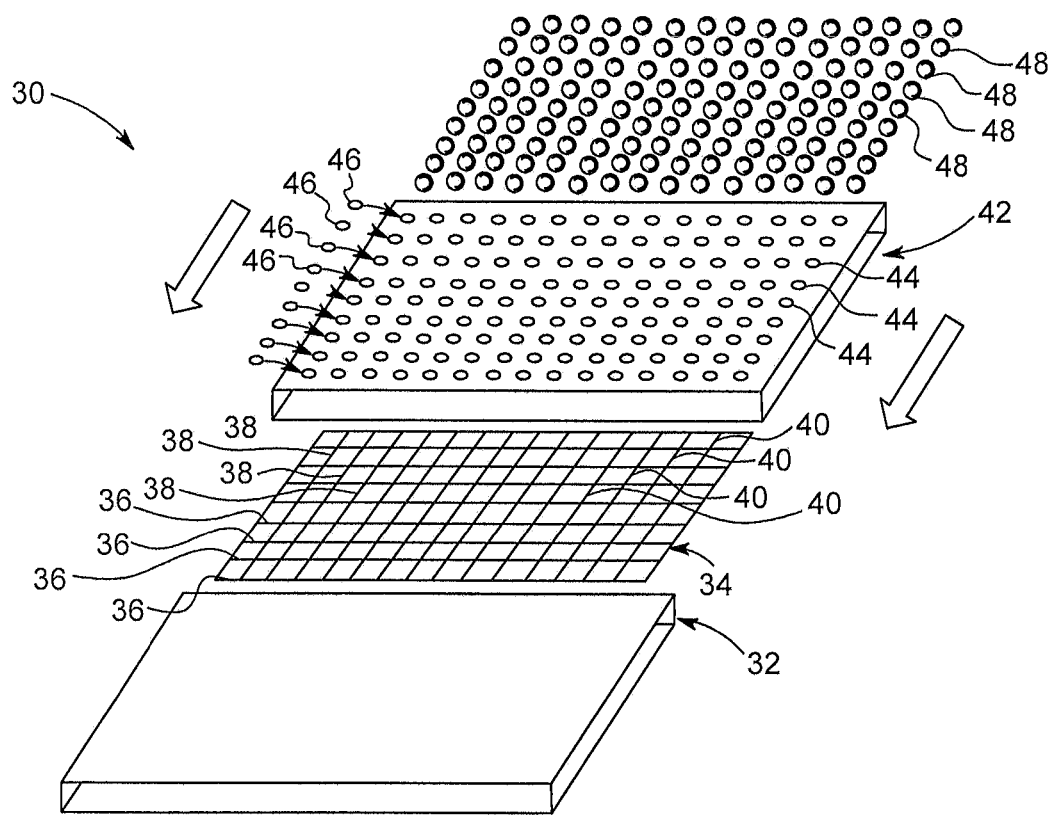
FIG. 6 is a perspective exploded of an improved package device simulator, the view showing the various layers of the package device simulator, the view showing a plurality of laterally extending traces and a plurality of transversely extending traces, where the intersection of the laterally extending traces and transversely extending traces connect to one another such that all traces are electrically connected to one another.
Figure 7:
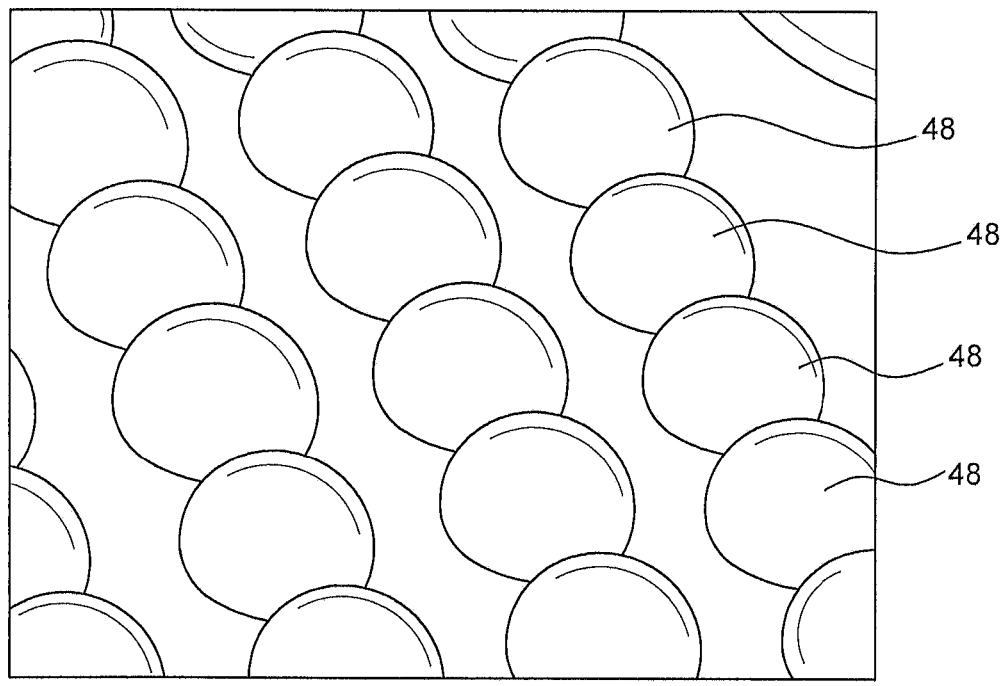
FIG. 7 is a close up perspective view of the bottom side of one example of the improved package device simulator, the view showing a plurality of protruding electrical contacts or balls.
Figure 8:
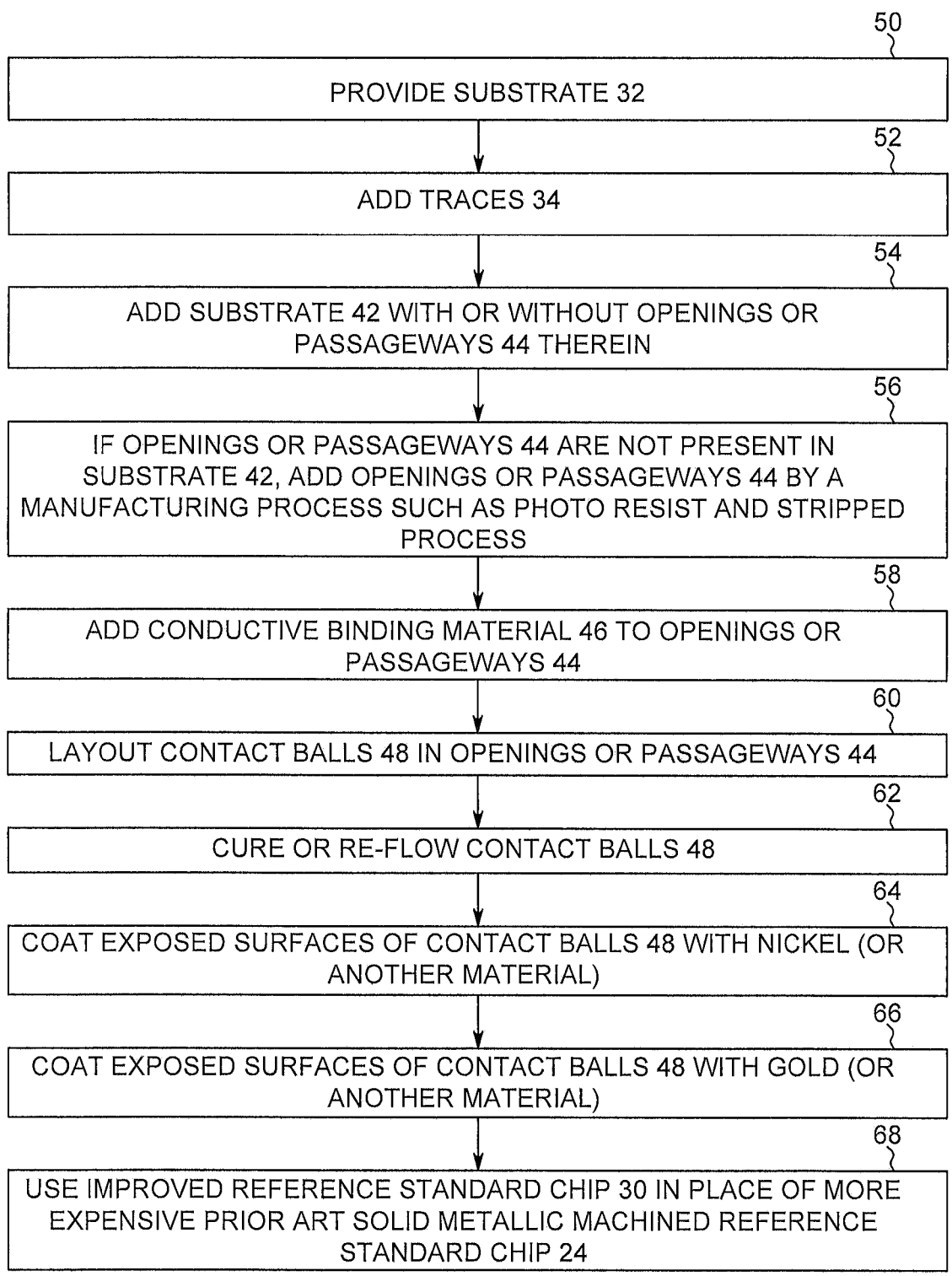
FIG. 8 is a flow chart of the manufacturing process of forming an improved package device simulator.

Multi-Domains:

The package device simulator 30 presented in FIG. 6 shows the laterally extending traces 36 intersecting with the transversely extending traces 38 thereby forming a grid where all traces 36, 38 are electrically connected to one another, and therefore all contact balls 48 are electrically connected to one another. This arrangement forms a package device simulator 30 essentially having a single quadrant, which is electrically similar to a conventional solid metal reference standard chip.

Figure 9:
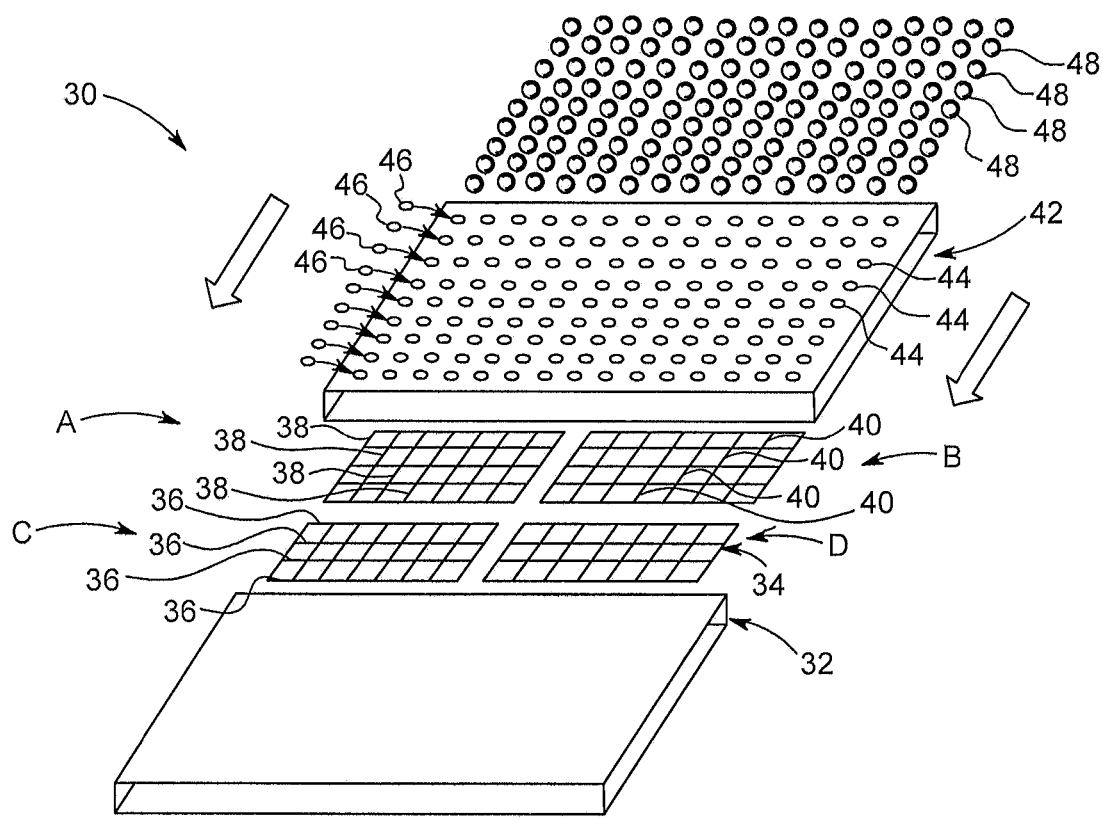
FIG. 9 is a perspective exploded of an improved package device simulator, the view showing the various layers of the package device simulator, the view showing a plurality of laterally extending traces and a plurality of transversely extending traces, the traces are isolated into four quadrants, wherein all traces within a quadrant are electrically connected to one another.

In contrast to the single quadrant arrangement presented in FIG. 6, a multi-domain package device simulator 30 or a multi-quadrant package device simulator 30 is presented in FIG. 9. In this arrangement, as one example, the package device simulator 30, includes four quadrants A, B, C, D which are each electrically isolated from one another while all contact balls 48 within each quadrant A, B, C, D are electrically connected to one another. In this arrangement, the package device simulator 30 is essentially divided down its middle, both laterally and transversely, by a space, an alley, a separation or any other insulating or isolating arrangement, thereby dividing the single package device simulator 30 essentially into four package device simulators 30, one in each corner, that are all connected together as a single device. In this arrangement, the intersections 40 of the laterally extending traces 36 and the transversely extending traces 38 within each quadrant, A, B, C, D electrically connect to one another.

In this arrangement, except along the boundaries of the package device simulator 30 and the boundaries of each quadrant A, B, C, D, each contact ball 48 is electrically connected to the adjacent contact balls 48. Or, said another way, each contact ball 48 is electrically connected to the surrounding contact balls 48 (except at the borders of each quadrant A, B, C, D). This arrangement is desirable in that various tests can be performed simultaneously within in each quadrant, such as contact resistance tests. Another improvement is that by having a plurality of domains, leakage tests can be performed between quadrants A, B, C, D. Yet another improvement is that both contact resistance tests as well as leakage tests can be performed using the same package device simulator 30. In addition, by providing the ability to perform contact resistance tests as well as leakage tests using the same package device simulator 30 this eliminates the need to remove and replace the package device simulator 30 thereby further reducing the time under test.

While in the arrangement shown in FIG. 9, four quadrants A, B, C, D, are shown, any number of quadrants are hereby contemplated for use such as five, six, seven, eight, nine, ten, eleven, twelve, thirteen, fourteen, fifteen, sixteen, seventeen, eighteen, nineteen, twenty, or more, up to hundreds or even thousands.

Figure 10:
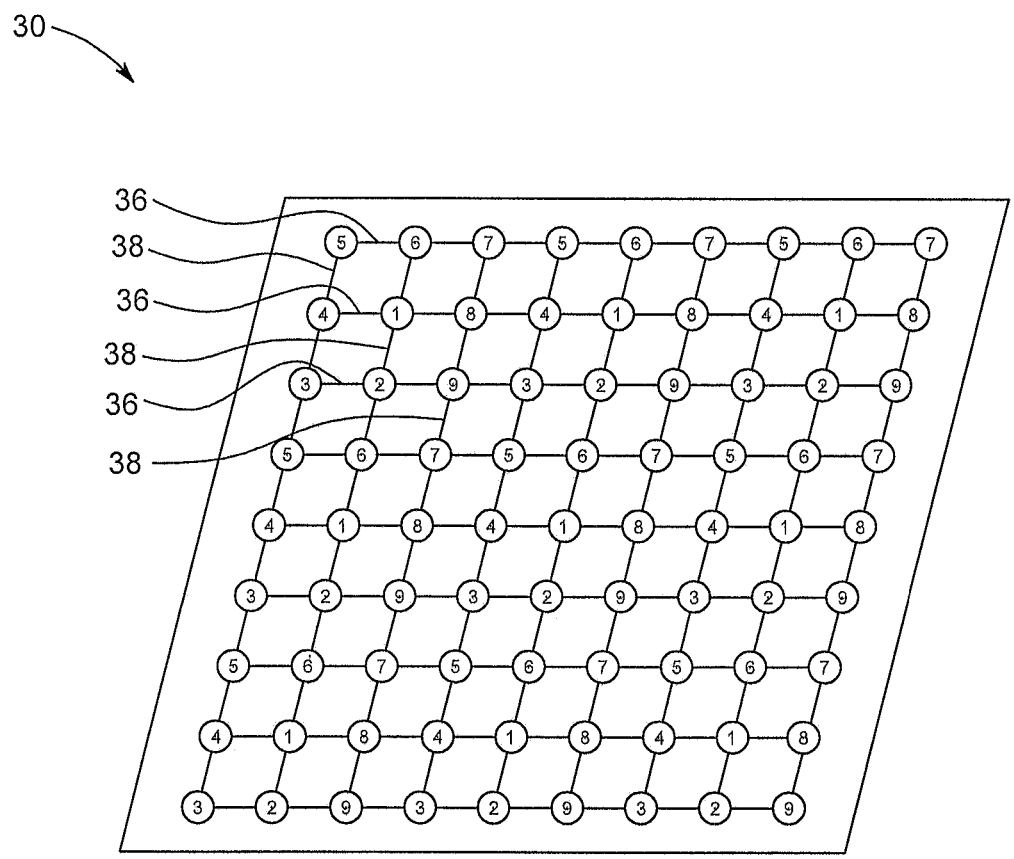
FIG. 10 is a perspective view of a simplified demonstrative of an improved package device simulator, the view showing a plurality of laterally extending traces and a plurality of transversely extending traces that electrically connect to contact balls (represented as numerals 1-9), wherein the domains or quadrants of contact balls (represented as numerals 1-9) are electrically isolated from the adjacent or neighboring contact balls (represented as numerals 1-9), that is the contact balls are electrically isolated from physically surrounding contact balls, thereby forming domains that overlap one another or domains that are not regionally isolated from one another.

In yet another alternative embodiment, with reference to FIG. 10, another example of a multi-domain package device simulator 30 or a multi-quadrant package device simulator 30 is presented. In the example presented in FIG. 9, the contact balls 48 within a quadrant of the multi-domain package device simulator 30 are electrically connected with its neighboring or adjacent contact balls 48. That is, in FIG. 9 the contact balls 48 within a quadrant are surrounded by electrically connected contact balls 48. In contrast, the arrangement presented in FIG. 10 the contact balls 48 are electrically isolated from the adjacent or neighboring contact balls 48. Or, said another way, contact balls 48 are electrically isolated from the surrounding contact balls 48. Or, said yet another way, a contact ball 48 is never next to another contact ball 48 in the same domain or quadrant.

In the arrangement shown in FIG. 10, there are nine domains or quadrants, each represented by numerals 1, 2, 3, 4, 5, 6, 7, 8 and 9. Each of the contact balls 48 of each of these domains or quadrants (1, 2, 3, 4, 5, 6, 7, 8 and 9) are surrounded by contact balls 48 of another domain or quadrant (1, 2, 3, 4, 5, 6, 7, 8 and 9). This creates nine quadrants or domains of contact balls 48 that intermingle across the array of contact balls 48.

The arrangement shown in FIG. 10 provides complexities in that the grid of traces 34 have a more sophisticated layout or design than the arrangements presented in FIG. 6 or FIG. 9. That is, many of the intersections 40 of traces 34 are electrically isolated or insulated from one another so as to electrically isolate spatially adjacent or neighboring contact balls 48. In this arrangement, the grid of traces 34 is formed in a similar fashion to the way silicon wafers are formed, utilizing a plurality of isolating layers with interconnecting conductors which allows for complex interconnecting and isolating patterns of the contact balls 48. This arrangement can be utilized to form interconnect patterns to create numerous interstitial domains of any size, shape and design. While this arrangement causes increased sophistication in the manufacturing process, this arrangement provides numerous advantages.

This arrangement is desirable in that various tests can be performed simultaneously within in each domain or quadrant (1, 2, 3, 4, 5, 6, 7, 8 and 9), such as contact resistance tests. Another improvement is that by having a plurality of domains, leakage tests can be performed between electrically isolated quadrants (note the term "quadrant" as used herein is not limited to four corners or four equal parts, but instead is intended to mean electrically isolated groups of contact balls 48). More specifically, as one example, adjacent contact balls 48 can be tested against one another, such as a leakage test, as they are in different domains or quadrants from one another, Yet another improvement is that both contact resistance tests as well as leakage tests can be performed using the same package device simulator 30. In addition, by providing the ability to perform contact resistance tests as well as leakage tests using the same package device simulator 30 this eliminates the need to remove and replace the package device simulator 30 thereby further reducing the time under test. In addition, contact balls 48 can be tested against their neighboring or adjacent contact balls 48 providing further information and more-thorough test results. In addition, because quadrants can extend across the entire area of the package device simulator 30, this essentially allows for testing of essentially any area of the package device simulator 30 against any other area of the package device simulator 30.

As such, by providing a package device simulator 30 having a plurality of electrically isolated sections or quadrants provides a great number of advantages including time savings as well as providing increased testing possibilities.

While nine domains or quadrants are shown in FIG. 10, any number of domains or quadrants is hereby contemplated for use. In addition, it is hereby contemplated that these domains or quadrants are formed of any design and can be isolated or interconnected in any manner.

BGA v. LGA:

While reference is made herein to an array contact balls 48, which is known as a "ball grid array" ("BGA"), the technology is equally applicable, and is hereby contemplated for use with, an array of lands, which is known as a "land grid array" ("LGA"). A ball grid array, or BGA, is a type of surface-mount packaging used for integrated circuits that provides for more interconnection pins than can be put on a dual in-line or flat package. That is, a BGA allows for up to the whole bottom surface of the device to be used for interconnection, instead of just the perimeter with shorter leads, on average, than with perimeter-only type packages, leading to better performance at high speeds. A land grid array, or LGA, is a type of surface-mount packaging for integrated circuits (ICs) that is notable for having the pins on the socket, rather than the integrated circuit.

The teachings herein related to contact balls 48, and a ball grid array are equally applicable to a device having lands, and therefore a land grid array. That is, a package device simulator 30 is hereby contemplated with lands, instead of contact balls 48. This package device simulator 30 having lands, instead of contact balls 48, can have a single domain, have multiple domains, or have multiple domains of any design, such as a design wherein contacts of one domain are physically and spatially isolated from other contacts of other domains.

From the above discussion it will be appreciated that a reduced cost package device simulator, manufacturing method and method of use shown and described herein improves upon the state of the art.

Specifically, the reduced cost package device simulator, manufacturing method and method of use: is inexpensive to manufacture; has less raw material costs therein; requires less lead time to manufacture; is easier to manufacture; provides a high quality connection with the contacts of the testing socket; has a low resistance; has a long useful life; can be easily custom manufactured; has an intuitive design; is durable; provides for multiple domains within the device simulator; allows for an electrical interconnection between any two contacts; allows for an electrical isolation between any two contacts; allows for simultaneous performance of multiple tests; among countless other advantages and improvements.

It will be appreciated by those skilled in the art that other various modifications could be made to the device without parting from the spirit and scope of this invention. All such modifications and changes fall within the scope of the claims and are intended to be covered thereby.

What is claimed is:

1. An improved package device simulator, comprising:
   a first layer, the first layer formed of a rigid non-conductive substrate;
   a second layer, the second layer formed of a plurality of traces, the plurality of traces including a plurality of laterally extending traces that intersect with a plurality of transversely extending traces at intersections;
   a third layer, the third layer formed of a rigid non-conductive substrate;
   the third layer having a plurality of openings that extend through the third layer;
   wherein the plurality of openings of the third layer align with the plurality traces of the second layer;
   a plurality of contact balls;
   the plurality of contact balls placed in the plurality of openings such that a portion of the contact balls extend above an upper surface of the third layer forming exposed surfaces;
   wherein the exposed surfaces of the plurality of contact balls are coated with at least one layer of conductive material; and
   conductive binding material in the plurality of openings in the third layer, the conductive binding material within an opening in contact with an exposed portion of the traces and the contact ball within the opening; and
   wherein the plurality of traces are electrically isolated into a plurality of quadrants.

2. The improved package device simulator of claim 1 wherein the third layer is adhered to the first layer thereby sealing the plurality traces between the first layer and the third layer.

3. The improved package device simulator of claim 1 wherein the improved package device simulator is cured thereby causing the plurality of contact balls to operably fuse with the traces.

4. The improved package device simulator of claim 1 wherein the traces are formed by a plating process.

5. The improved package device simulator of claim 1 wherein the least one layer of conductive material is added by a plating process.

6. The improved package device simulator of claim 1 wherein the least one layer of conductive material includes a layer of nickel or nickel alloy.

7. The improved package device simulator of claim 1 wherein the least one layer of conductive material includes a layer of gold or gold alloy.

8. The improved package device simulator of claim 1 wherein the least one layer of conductive material includes a layer of nickel or nickel alloy followed by a layer of gold or gold alloy.

9. The improved package device simulator of claim 1 wherein the contact balls are formed of balls primarily of a material selected from the group consisting of copper, a copper alloy, tin-lead, a tin-lead alloy, Sn-3.5Ag, SAC105, SAC305 and SAC405.

10. The improved package device simulator of claim 1 wherein there are four quadrants.

11. A method of manufacturing an improved package device simulator, the method of comprising the steps of:
    providing a first layer, the first layer formed of a non-conductive rigid substrate;
    adding a second layer to the first layer, the second layer formed of a plurality of electrically conductive traces;
    adding a third layer to the second layer and the first layer, the third layer formed of a non-conductive rigid substrate, the third layer having a plurality of openings that extend through the third layer and are aligned with the plurality of electrically conductive traces such that a portion of the plurality of electrically conductive traces of the second layer are exposed by the plurality of openings in the third layer;
    adding contact balls to the plurality of openings in the third layer;
    curing the improved package device simulator thereby causing the contact balls to operably fuse with the plurality of electrically conductive traces;
    coating exposed surfaces of the contact balls with at least one layer of conductive material;
    adding conductive binding material in the plurality of openings in the third layer and in contact with the plurality of electrically conductive traces and the contact balls;
    wherein the plurality of electrically conductive traces are electrically isolated into a plurality of quadrants.

12. The method of claim 11 further comprising the step of adhering the third layer to the first layer thereby sealing the plurality of electrically conductive traces between the first layer and the third layer.

13. The method of claim 11 wherein the least one layer of conductive material is added by a plating process.

14. The method of claim 11 wherein the least one layer of conductive material includes a layer of nickel or nickel alloy.

15. The method of claim 11 wherein the least one layer of conductive material includes a layer of gold or gold alloy.

16. The method of claim 11 wherein the contact balls are formed primarily of a material selected from the group consisting of copper, a copper alloy, tin-lead, a tin-lead alloy, Sn-3.5Ag, SAC105, SAC305 and SAC405.

17. The method of claim 11 wherein there are four quadrants.

18. An improved package device simulator, comprising:
a first layer, the first layer formed of a rigid non-conductive substrate;
a second layer, the second layer formed of a plurality of traces, the plurality of traces including a plurality of laterally extending traces that intersect with a plurality of transversely extending traces at intersections;
a third layer, the third layer formed of a rigid non-conductive substrate;
the third layer having a plurality of openings that extend through the third layer;
wherein the plurality of openings of the third layer align with the plurality of traces of the second layer;
a plurality of contact balls;
the plurality of contact balls positioned in the plurality of openings such that a portion of the contact balls extend above an upper surface of the third layer forming exposed surfaces; and
conductive binding material in the plurality of openings in the third layer, the conductive binding material within an opening in contact with an exposed portion of the traces and the contact ball within the opening
wherein the exposed surfaces of the plurality of contact balls are coated with at least one layer of conductive material;
wherein the plurality of traces are electrically isolated into a plurality of quadrants; and
wherein there are up to one hundred quadrants.

19. The improved package device simulator of claim 1 wherein the contact balls of a quadrant are positioned adjacent to one another.

20. The improved package device simulator of claim 1 wherein the contact balls of a quadrant are electrically isolated from adjacent contacts.

21. The improved package device simulator of claim 1 wherein there are up to twenty-thousand contact balls.

22. The improved package device simulator of claim 1 wherein the contact balls of a quadrant are spread across the improved package device simulator.

23. The improved package device simulator of claim 1, wherein each of the plurality of quadrants includes a plurality of contact balls.

24. The method of claim 11 wherein each of the plurality of quadrants includes a plurality of contact balls.

25. The improved package device simulator of claim 18, wherein each of the plurality of quadrants includes a plurality of contact balls.

26. The improved package device simulator of claim 1, wherein there are up to one hundred quadrants.

27. The improved package device simulator of claim 1, wherein the plurality of traces are electrically connected to the plurality of contact balls.

28. The method of claim 11 wherein the plurality of electrically conductive traces are electrically connected to the contact balls.

29. The improved package device simulator of claim 18, wherein the plurality of traces are electrically connected to the plurality of contact balls.

* * * * *